United States Patent
Kukkonen

[19]

[11] Patent Number: 5,859,573
[45] Date of Patent: Jan. 12, 1999

[54] CIRCUIT FOR SEPARATING THE OUTPUT OF AN OSCILLATOR FROM THE OTHER PARTS OF A MOBILE COMMUNICATION SYSTEM

[75] Inventor: Osmo Kukkonen, Salo, Finland

[73] Assignee: Nokia Mobile Phones, Ltd., Espoo, Finland

[21] Appl. No.: 898,875

[22] Filed: Jul. 23, 1997

[30] Foreign Application Priority Data

Jul. 25, 1996 [FI] Finland ..................... 962966

[51] Int. Cl.$^6$ .............. H03B 5/12; H03B 1/00; H03L 5/00
[52] U.S. Cl. ............. 331/75; 331/74; 331/117 R; 331/183; 331/177 V
[58] Field of Search ............. 331/74–77, 116 R, 331/116 FE, 116 M, 117 R, 117 FE, 117 D, 182, 183, 177 V; 455/75, 63, 39, 73

[56] References Cited

U.S. PATENT DOCUMENTS

| | | | |
|---|---|---|---|
| 3,260,960 | 7/1966 | Bangert | 331/74 X |
| 5,164,685 | 11/1992 | Niemio | 331/8 |
| 5,357,222 | 10/1994 | Hietala | 332/124 |
| 5,446,417 | 8/1995 | Korhonen et al. | 331/57 |
| 5,534,825 | 7/1996 | Goma et al. | 331/117 R |
| 5,564,100 | 10/1996 | Huang et al. | 331/74 X |
| 5,576,667 | 11/1996 | Goma | 331/117 D |

FOREIGN PATENT DOCUMENTS

| | | |
|---|---|---|
| 4219990 A1 | 12/1993 | Germany . |
| WO 94/00912 | 1/1994 | WIPO . |

*Primary Examiner*—David Mis
*Attorney, Agent, or Firm*—Perman & Green, LLP

[57] ABSTRACT

The invention concerns oscillator circuits, more particularly coupling arrangements between an oscillator and an amplifier stage following the oscillator. The solution according to the invention optimizes the intensity of the coupling between the oscillator and the following amplifier stage so that the desired output level of the oscillator circuit is gained but the oscillator is loaded as little as possible. In the system according to the invention, the impedance value of the circuit element between the oscillator and the amplifier stage has been arranged to be automatically adjustable so that it is always adjusted to its smallest value, on which the desired output level of the oscillator coupling can still be gained. The coupling can, for example, be formed by means of a capacitance diode, the bias voltage of which is adjusted according to the direct voltage detected at the output level of the amplifier stage.

19 Claims, 3 Drawing Sheets

CIRCUIT FOR SEPARATING THE OUTPUT OF AN OSCILLATOR FROM THE OTHER PARTS OF A MOBILE COMMUNICATION SYSTEM

BACKGROUND OF THE INVENTION

The present invention concerns oscillator circuits and more particularly coupling arrangements between an oscillator circuit and an amplifier stage following the oscillator circuit.

1. Field of the Invention

Oscillator circuits typically consist of an actual high-frequency generating oscillator and an amplifier stage, the purpose of which is to minimize the loading effect on the actual oscillator. The high-frequency signal generated by the oscillator is not until from the output of the amplifier stage led to the other parts of the system.

2. Description of the Prior Art

Loading of the oscillator effects the noise performance of the oscillator and increases i.a. the phase noise. For this reason, special amplifier stages are used in oscillator circuits between the oscillator and the other parts of the system, so that the loading effect generated by the system and especially the variation of this load would have no influence on the oscillator circuit.

FIG. 1 illustrates a typical oscillator circuit of prior art. The frequency of the voltage-controlled oscillator 2 is adjusted with control voltage $V_c$ that adjusts the junction capacitance of the capacitance diode D1 that belongs to the resonance circuit of the oscillator. The amplifier stage 4 is coupled to the oscillator with coupling capacitor $C_k$. The output signal of the oscillator circuit is brought to the other parts of the system through the output OUT.

Selection of the coupling capacitor $C_k$ has a significant influence on the characteristics of the oscillator circuit. In principle, the capacitance value of the coupling capacitor should be as low as possible in order to minimize the load on the resonance circuit. The loading effect on the resonance circuit degrades the Q value of the resonance circuit, that causes undesirable effects, such as phase noise. In order to minimize the load, the signal is in most cases taken to the amplifier stage from the oscillator transistor, in oscillator circuits with couplings of the type shown in FIG. 1. A more preferable point for signal output would be the end 6 of the resonance circuit, because at that point the resonance circuit acts like a band pass filter decreasing the noise of the oscillator signal. However, in most cases this can't be done because of the loading effect of the amplifier stage.

Decreasing the capacitance value of the coupling capacitor $C_k$ has another advantage, too: the smaller this capacitance value is, the better the oscillator is isolated from the output OUT of the amplifier stage. Good isolation between the stages is of advantage, because then the variation of the output load of the amplifier stage has no influence on the load the oscillator is subjected to, and so it does not cause any frequency and phase errors.

On the other hand, decreasing of the capacitance value of the coupling capacitor $C_k$ decreases the level of the high-frequency signal that couples to the amplifier stage, whereby it is more difficult to gain the desired output level of the whole oscillator circuit. Thus, the selection of the capacitance value is always a compromise with respect to the oscillator signal interference and the output level. In volume production this is a problem, as the coupling capacitor $C_k$ must always be dimensioned so big that in different devices of the production lot, the output level has always the magnitude of at least a certain, desired value, irrespective of the variations of the values within the tolerances of the components of the circuit. Thus, in most appliances the value of the coupling capacitor $C_k$ is not optimal, whereby the signal quality of the oscillator circuit suffers.

This problem becomes especially emphasized with voltage-controlled oscillators implemented with capacitance diodes. The Q value of capacitance diodes is relatively low, which causes strong noise sidebands compared with e.g. oscillators with fixed frequency implemented with mica capacitors. Oscillators with capacitance diode adjustment are, however, used especially in frequency synthesizers of portable radio devices, because they are suitable to be integrated with usual manufacturing techniques of integrated circuits.

OBJECTS OF THE INVENTION

An object of the present invention is to provide an oscillator circuit in which the loading effect of the oscillator would be as small as possible but which still would gain the desired output signal level. A further object of the invention is to provide an oscillator circuit which is well suitable for volume production as a part of an integrated circuit. A still further object of the invention is to provide an oscillator circuit, the output level of which is substantially constant despite the variation of the component values in the volume production.

SUMMARY OF THE INVENTION

The objects are achieved by arranging the adjusting element combining the oscillator and the following circuit element to be automatically adjustable, so that the loading effect that the oscillator is subjected to, caused by the circuit element following the oscillator, will be minimized with a desired output level of the oscillator circuit.

The system according to the invention is characterized in that the input of the first circuit element is operationally coupled to the oscillator means via a circuit element having an adjustable impedance, and that the oscillator circuit further comprises an adjusting element being arranged to adjust the impedance of said adjustable circuit element according to the alternating voltage level effective at the output of said first circuit element in order to minimize the loading effect of said first circuit element on the oscillator means with a certain desirable alternating voltage level effective at the output of the first circuit element.

The method according to the invention is characterized in that the impedance of the operational coupling between the oscillator means and the first circuit element is adjusted according to the alternating voltage level effective at the output of said first circuit element in order to minimize the loading effect of said first circuit element on the oscillator means with a certain desired alternating voltage level effective at the output of the first circuit element.

In the solution according to the present invention, a coupling capacitor $C_k$ of prior art is replaced with an adjustable element, having e.g. capacitance as adjustable characteristic. An adjusting element added to the oscillator circuit adjusts the loading effect on the oscillator to the smallest possible value so that the desired output level of the oscillator circuit is gained. Then, the loading effect of the oscillator is minimized and the separation between the oscillator and the amplifier stage is maximized. The adjusting element can be formed e.g. by a capacitance diode, the bias voltage of which is adjusted according to the direct voltage detected from the output signal level of the amplifier stage or another circuit element following the oscillator circuit.

BRIEF DESCRIPTION OF THE DRAWINGS

The present invention will now be explained in more detail with reference to the exemplified preferred embodiments and enclosed drawings, wherein.

In the Figures, the corresponding components are marked with the same reference numerals and markings.

DETAILED DESCRIPTION OF THE PREFERRED EMBODIMENTS

Figure 1:
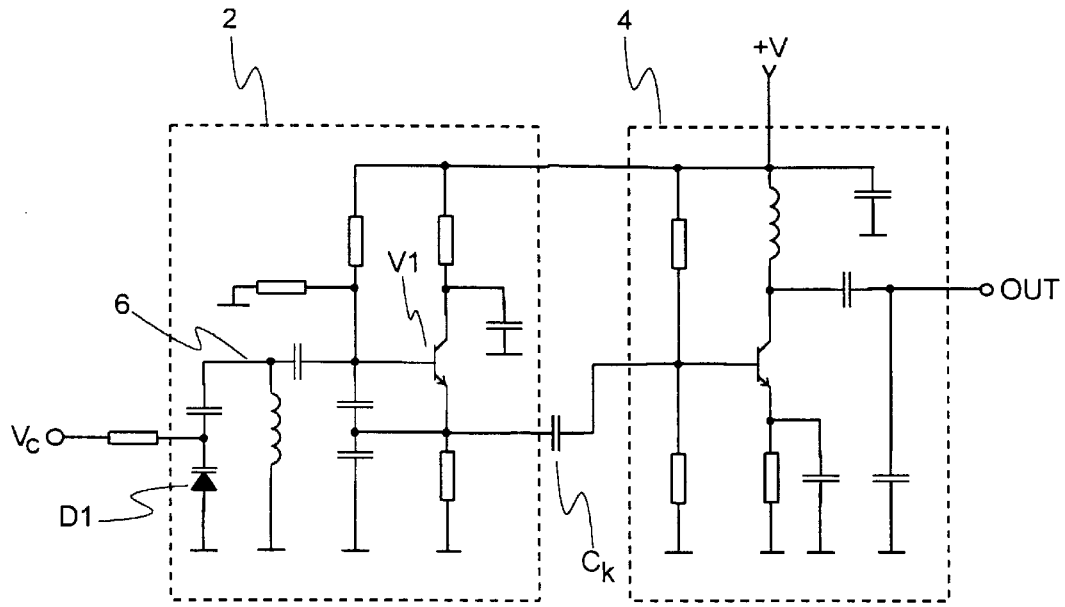
FIG. 1 illustrates a voltage-controlled oscillator circuit of prior art.
Figure 2:
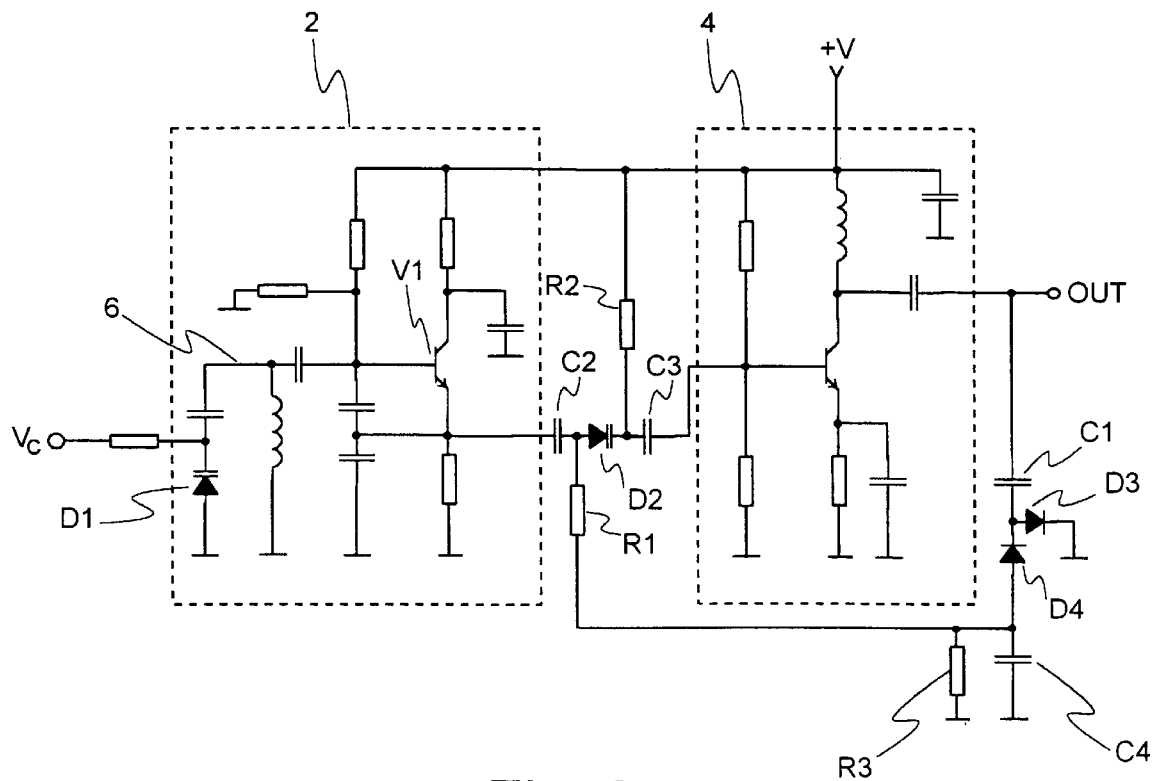
FIG. 2 illustrates one solution in accordance with the present invention for coupling the oscillator and the amplifier stage.

FIG. 2 illustrates a solution according to the present invention, applied to an oscillator circuit according to FIG. 1. In a system shown in the figure, the coupling capacitor is implemented with an adjustable capacitance D2, that is in this example a capacitance diode. The coupling adjusts the capacitance value to be lowest possible, by which the desired output level is gained. The adjustment is implemented with help of the direct voltage level detected from the high-frequency signal.

Diodes D3 and D4 act in the level clamper/voltage multiplier circuit well known by a man skilled in the art, to which circuit a high-frequency signal is coupled by means of capacitor C1. Capacitor C1 acts at the same time preferably as a part of the output matching circuit of the amplifier stage. The detected direct voltage level that in the circuit example of FIG. 2 is negative, is led to the anode of the capacitance diode D2 by means of resistance R1. The resistance value of resistor R1 is preferably high for minimizing the high-frequency losses caused to the output side of the amplifier stage.

A reverse direction voltage is formed over the capacitance diode D2 by means of voltages brought by resistors R1 and R2. This voltage determines the junction capacitance of the capacitance diode D2 and thus the intensity of the coupling between the oscillator 2 and the amplifier stage 4. The higher the high-frequency output signal level of the output OUT of the amplifier stage is, the bigger will be the reverse direction voltage of the capacitance diode D2, whereby the junction capacitance of diode D2 decreases and the high-frequency level coupling to the amplifier stage 4 decreases. Thus, the adjustment acts as a negative feedback coupling with respect to the output signal level of the amplifier stage. Capacitors C2 and C3 act as DC blocking capacitors. Capacitances of capacitors C2 and C3 are preferably big compared with the junction capacitance of diode D2, so that the total value of these three capacitances connected in series is substantially determined by the junction capacitance of diode D2. Function of the resistor R3 is to ensure the reverse direction voltage across the capacitance diode D2 in a starting situation. Resistor R3 discharges the capacitors and the anode of diode D2, when the power is disconnected from the system.

Figure 3:
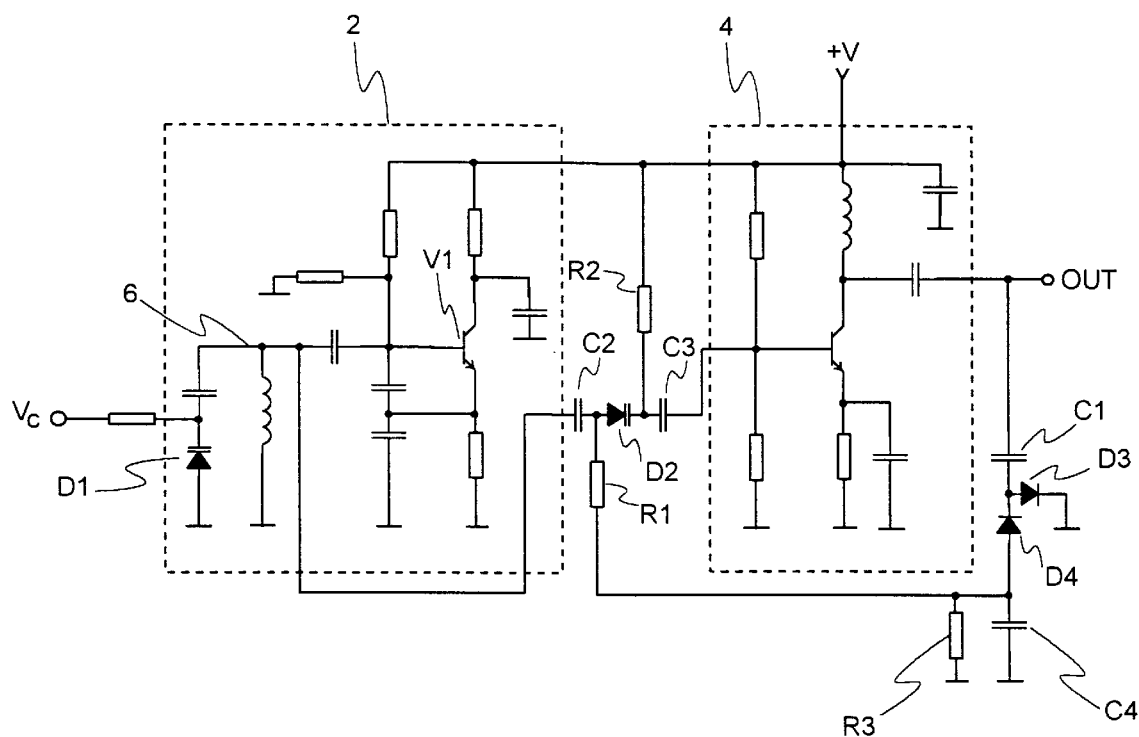
FIG. 3 illustrates a second preferred embodiment in accordance with the present invention for coupling the oscillator and the amplifier stage.

In circuits of FIGS. 1 and 2, the signal of the oscillator is taken out from the emitter of transistor V1 of the oscillator, so that the loading on the resonance circuit would be minimized and its Q value would remain good. As described above, the signal can also be taken out from the resonator, whereby the signal includes as little as possible harmonic and other undesirable frequency components because of the filtering effect of the resonance circuit. With a circuit according to the invention, the harmful loading effect on the resonance circuit can be minimized, whereby the signal can also be taken out directly from the resonance circuit as shown in FIG. 3. In the solution according to the present invention, the signal output point of the oscillator circuit is in no way limited.

Also other components than those with voltage- or current-adjustable capacitance can be used in the invention. As adjustable element also e.g. a PIN diode, bipolar transistor or field-effect transistor can be used. The adjustment can influence also the impedance between the oscillator and amplifier stage e.g. by adjusting the input impedance of the amplifier stage, whereby the adjustment influences the input resistance of the amplifier stage and the capacitance or inductance. This kind of an adjustment maximizes the input impedance of the amplifier stage so that its loading effect on the oscillator is minimized on the desired OUT level.

The control voltage of the capacitance element can be formed in many other ways, too, than those described in FIGS. 2 and 3. For example, the level of the control voltage detected from the output signal can be increased by means well known by a man skilled in the art: by voltage multiplication by increasing the number of stages of the voltage multiplier formed by the detection diodes (in this example D3 and D4), until the desired control voltage level on a certain level of output signal is gained. Through selection of the magnitude of the control voltage and the type of the capacitance diode, a coupling in accordance with the present invention equipped with desired characteristics can be formed.

Also, the solution in accordance with the present invention is not limited to the use of negative control voltage as described in FIGS. 2 and 3. The control signal can be positive, as well, if the bias voltage coupling of the capacitance diode D2 is correspondingly changed in a way known by a man skilled in the art.

A solution in accordance with the invention is applicable to all kinds of oscillator circuits. The voltage-controlled oscillator circuit of FIGS. 2 and 3 is only described as an example of one preferred application. Also the described circuits of the voltage-adjusted oscillator and the amplifier stage following it are only examples of some possible ways to implement said elements. The amplification element 4 described in the figures comprises only one amplifier stage, but the solution according to the invention is also applicable to systems where the amplification element 4 of the oscillator circuit comprises more than one amplifier stage. In that case the adjustment signal of the capacitance element D2 can be formed based on the output signal level of any amplifier stage.

The invention is also applicable in a system where the output signal of the oscillator circuit is coupled to some other kind of a circuit element than an amplifier stage, e.g. to a filter. With a construction in accordance with the invention, also there the loading effect on the oscillator can be adjusted according to the signal level of some circuit element operationally coupled to the oscillator.

The oscillator circuit according to the invention can advantageously be used as a local oscillator circuit of a mobile communication means, such as a radio telephone, a cellular telephone combined with a PDA (Personal Digital Assistant) device, or similar means. The demands placed on the quality of the local oscillator signal are very high in such an application.

In the receiver of a mobile communication means, the local oscillator signal is mixed with the received signal to form an intermediate frequency signal. In a direct conversion receiver the received signal is mixed with the local oscillator signal to directly produce a base frequency signal. In the transmitter part of a mobile communication means a signal modulated with a base frequency signal is mixed with the local oscillator signal to produce a transmitting frequency signal.

Figure 4:
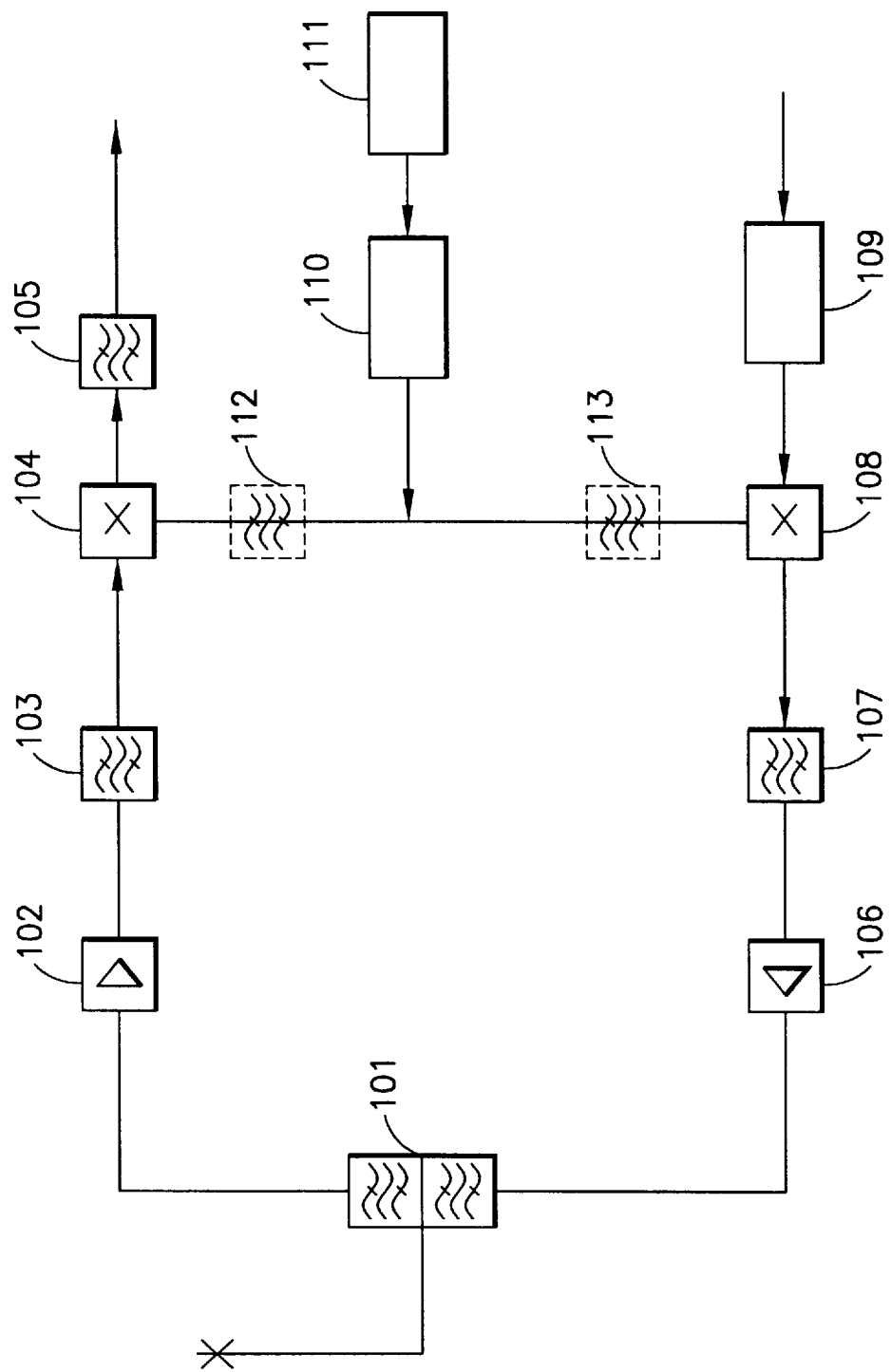
FIG. 4 illustrates one advantageous embodiment of the invention, where an oscillator circuit according to the invention is applied within a mobile communication means.

FIG. 4 shows an example of a block diagram of a mobile communication means comprising an oscillator circuit according to the invention. The reference numerals denote the following:

101 is a duplex filter for separating the transmitted and received signals, 102 is the high frequency amplifier of the receiver part, 103 is the band pass filter of the receiver part, 104 is the mixer of the receiver part, 105 is the intermediate frequency filter of the receiver part, 106 is the output amplifier stage of the transmitter part, 107 is the band pass filter of the transmitter part, 108 is the mixer of the transmitter part, 109 is the modulator of the transmitter part, 110 is the oscillator circuit according to the invention, 111 is the frequency synthesizer circuit controlling the oscillator circuit according to the invention.

One of the objects of the invention is to prevent the load variations at the output of the amplifier stage of the oscillator circuit from affecting the quality of the oscillator signal. Such a varying load is presented to the oscillator circuit commonly in communication means according to the TDMA (Time Division Multiple Access) technique. FIG. 4 shows an example of such communication means. In the system of FIG. 4, the oscillator circuit 110 according to the invention feeds both the mixer of the receiver 104 and the mixer of the transmitter 108. In a time division system, the transmitting periods and receiving periods do not occur at the same time. In mobile communication means, where power saving is important, the transmitter part is powered only when the transmitter part is in use, and correspondingly the receiver part is powered only, when the receiver part is in use. The input impedances of said mixers 104, 108 typically change when the mixers' operating voltage is switched on and off. Therefore, the impedance presented to the output of the oscillator circuit 110 is not constant. Therefore, the oscillator circuit according to the invention can be advantageously used in a TDMA mobile communication means.

A solution in accordance with the invention minimizes the loading effect on the resonance circuit of the oscillator with a certain output signal level, at the same time maximizing the separation between the oscillator and the output of the amplifier stage. A solution in accordance with the invention helps stabilizing the level of the output signal and decreases the variation of the output signal level caused by the variation of the values within the tolerances of the components.

Because a coupling arrangement in accordance with the invention minimizes the loading effect on the oscillator, the invention provides more freedom for solutions concerning the signal output of the oscillator according to tile requirements of each application, respectively.

A solution in accordance with the invention is very suitable to be integrated by means of conventional manufacturing processes of integrated circuits. This is a significant advantage especially for circuit solutions of mobile telephones.

I claim:

1. An oscillator circuit, connected with other parts in a communication system, and having an oscillator and a first circuit element, with its input coupled to the output of said oscillator, for separating the output of the oscillator from the other parts of the communication system, said oscillator circuit comprising:

a second circuit element, having an adjustable impedance, and coupling said first circuit element to said oscillator; and an adjusting element arranged to adjust the impedance of said second circuit element according to the alternating voltage level effective at the output of said first circuit element in order to minimize the loading effect of said first circuit element on the oscillator when there is a certain desirable alternating voltage level effective at the output of the first circuit element.

2. An oscillator circuit in accordance with claim 1, wherein said first circuit element is an amplifier element.

3. An oscillator circuit in accordance with claim 2, wherein said amplifier element comprises more than one amplifier stage.

4. An oscillator circuit in accordance with claim 1, wherein said adjusting element comprises a diode detector coupled as a voltage multiplier.

5. An oscillator circuit in accordance with claim 1, wherein said oscillator comprises a resonance circuit and said second circuit element is coupled to the resonance circuit of said oscillator.

6. An oscillator circuit in accordance with claim 1, wherein said second circuit element has its impedance adjusted by an element adjustable by its capacitance, and said adjusting element is arranged to adjust the capacitance value of said element adjustable by its capacitance according to the alternating voltage level effective at the output of said first circuit element in order to minimize the capacitance value of said second circuit element when there is a certain desired alternating voltage level effective at the output of the first circuit element.

7. An oscillator cicuit in accordance with claim 6, wherein said said second circuit element is a capacitance diode.

8. A method for controlling the operation of an oscillator circuit, connected with other parts in a communication system, and comprising an oscillator and a first circuit element, comprising the steps of:

disposing said first circuit element for separating the output of the oscillator from the other parts of the communication system with the input of the first circuit element being coupled to the oscillator output by a coupling element; and adjusting the impedance of the coupling element between the oscillator and the first circuit element according to the alternating voltage level effective at the output of said first circuit element in order to minimize the loading effect of said first circuit element on the oscillator when there is a certain desired alternating voltage level effective at the output of the first circuit element.

9. A method in accordance with claim 8, wherein said adjusting step comprises forming a direct voltage signal indicative of the alternating voltage level effective at the output of said first circuit element, and feeding said direct voltage signal to an adjustable impedance component in said coupling element connecting said oscillator and said first circuit element in order to change the impedance value of said adjustable impedance component.

10. A method in accordance with claim 8, wherein said first circuit element is an amplifier element.

11. A method in accordance with claim 10, wherein said amplifier element comprises more than one amplifier stage.

12. A method in accordance with claim 8, wherein said coupling element comprises a diode detector coupled as a voltage multiplier.

13. A method in accordance with claim 8, wherein said oscillator comprises a resonance circuit and said coupling element is coupled to said resonance circuit.

14. Mobile communication system having a number of parts comprising;
- an oscillator circuit with an oscillator and a first circuit element for separating the output of the oscillator from the other parts of the mobile communication system, the input of the first circuit element being coupled to the oscillator;
- a second circuit element by which the input of said first circuit element is coupled to the oscillator, said second circuit element having an adjustable impedance; and
- an adjusting element arranged to adjust the impedance of said second circuit element according to the alternating voltage level effective at the output of said first circuit element in order to minimize the loading effect of said first circuit element on the oscillator when there is a certain desirable alternating voltage level effective at the output of the first circuit element.

15. An oscillator circuit, connected with other parts in a communication system, comprising:
- an oscillator having an output;
- a first circuit element, having an input coupled to said oscillator output, for separating said oscillator output from the other parts of the communication system;
- a second circuit element, having an adjustable impedance, with an input connected to said oscillator output and an output connected to said input of said first circuit element;
- an adjusting element for adjusting the impedance of said second circuit element in response to the signal level effective at the output said first circuit element;
- an amplifier stage in said first circuit element for producing the separation of the output of said oscillator from the other parts of the communication system; and
- a diode detector, coupled as a voltage multiplier in said adjusting element, for producing an adjusting control signal in accordance with the signal level effective at the output of the first circuit element.

16. An oscillator circuit in accordance with claim 15, wherein said oscillator comprises a resonance circuit and said second circuit element is coupled to the resonance circuit of said oscillator.

17. An oscillator circuit in accordance with claim 15, wherein said adjusting element is adjustable by its capacitance, and its capacitance value is adjustable by said adjusting control signal.

18. An oscillator cicuit in accordance with claim 17, wherein said adjusting element is a capacitance diode.

19. An oscillating circuit in accordance with claim 17, wherein said diode detector produces an adjusting control signal in the forming of a direct voltage signal indicative of the alternating voltage level effective at the output of said first circuit element, and said direct voltage signal is coupled to said adjusting element to change the impedance value of said adjusting element.

* * * * *